United States Patent
Wang et al.

(10) Patent No.: US 11,778,922 B2
(45) Date of Patent: Oct. 3, 2023

(54) SEMICONDUCTOR DEVICE AND METHOD FOR FABRICATING THE SAME

(71) Applicant: UNITED MICROELECTRONICS CORP., Hsin-Chu (TW)

(72) Inventors: Hui-Lin Wang, Taipei (TW); Tai-Cheng Hou, Tainan (TW); Wei-Xin Gao, Tainan (TW); Fu-Yu Tsai, Tainan (TW); Chin-Yang Hsieh, Tainan (TW); Chen-Yi Weng, New Taipei (TW); Jing-Yin Jhang, Tainan (TW); Bin-Siang Tsai, Changhua County (TW); Kun-Ju Li, Tainan (TW); Chih-Yueh Li, Taipei (TW); Chia-Lin Lu, Taoyuan (TW); Chun-Lung Chen, Tainan (TW); Kun-Yuan Liao, Hsinchu (TW); Yu-Tsung Lai, Tainan (TW); Wei-Hao Huang, New Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 95 days.

(21) Appl. No.: 17/533,003

(22) Filed: Nov. 22, 2021

(65) Prior Publication Data
US 2022/0085283 A1    Mar. 17, 2022

Related U.S. Application Data

(60) Continuation of application No. 17/134,460, filed on Dec. 27, 2020, which is a division of application No. (Continued)

(30) Foreign Application Priority Data

Dec. 27, 2018 (CN) .......................... 201811612412.5

(51) Int. Cl.
*H01L 41/47* (2013.01)
*H10N 50/10* (2023.01)
(Continued)

(52) U.S. Cl.
CPC ........... *H10N 50/10* (2023.02); *H01L 21/762* (2013.01); *H01L 21/76802* (2013.01); *H10N 50/80* (2023.02); *H10N 35/01* (2023.02)

(58) Field of Classification Search
CPC . H01L 43/08; H01L 21/762; H01L 21/76802; H01L 43/02; H01L 41/47; H01L 27/222; H01L 43/12; H01L 27/228
See application file for complete search history.

(56) References Cited

U.S. PATENT DOCUMENTS 6,030,881 A    2/2000 Papasouliotis et al.
6,531,377 B2   3/2003 Knorr et al.
(Continued)

FOREIGN PATENT DOCUMENTS

CN    102738225 A    10/2012
CN    105977202 A    9/2016
(Continued)

*Primary Examiner* — Selim U Ahmed
(74) *Attorney, Agent, or Firm* — Winston Hsu

(57) ABSTRACT

A method for fabricating semiconductor device includes first forming a first magnetic tunneling junction (MTJ) and a second MTJ on a substrate, performing an atomic layer deposition (ALD) process or a high-density plasma (HDP) process to form a passivation layer on the first MTJ and the second MTJ, performing an etching process to remove the passivation layer adjacent to the first MTJ and the second MTJ, and then forming an ultra low-k (ULK) dielectric layer on the passivation layer.

13 Claims, 14 Drawing Sheets

Related U.S. Application Data

16/255,754, filed on Jan. 23, 2019, now Pat. No. 10,916,694.

(51) Int. Cl.
  *H01L 21/768* (2006.01)
  *H01L 21/762* (2006.01)
  *H10N 50/80* (2023.01)
  *H10N 35/01* (2023.01)

(56) References Cited

U.S. PATENT DOCUMENTS

| | | |
|---|---|---|
| 2005/0112879 A1 | 5/2005 | Fujimoto |
| 2005/0153505 A1* | 7/2005 | Gambino ............ H01L 23/5329 257/E21.279 |
| 2013/0052752 A1 | 2/2013 | Satoh |
| 2019/0140019 A1* | 5/2019 | Nagel .................... H10N 50/01 |
| 2019/0165260 A1 | 5/2019 | Yu |

FOREIGN PATENT DOCUMENTS

| | | |
|---|---|---|
| CN | 106298831 A | 1/2017 |
| CN | 107068856 A | 8/2017 |

* cited by examiner

SEMICONDUCTOR DEVICE AND METHOD FOR FABRICATING THE SAME

CROSS REFERENCE TO RELATED APPLICATIONS

This is a continuation application of U.S. patent application Ser. No. 17/134,460, filed on Dec. 27, 2020, which is a division of U.S. patent application Ser. No. 16/255,754, filed Jan. 23, 2019, all of which are hereby incorporated by reference in their entirety.

BACKGROUND OF THE INVENTION

1. Field of the Invention

The invention relates to a semiconductor device and method for fabricating the same, and more particularly to a magnetoresistive random access memory (MRAM) and method for fabricating the same.

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a method for fabricating semiconductor device includes first forming a first magnetic tunneling junction (MTJ) and a second MTJ on a substrate, performing an atomic layer deposition (ALD) process or a high-density plasma (HDP) process to form a passivation layer on the first MTJ and the second MTJ, performing an etching process to remove the passivation layer adjacent to the first MTJ and the second MTJ, and then forming an ultra low-k (ULK) dielectric layer on the passivation layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
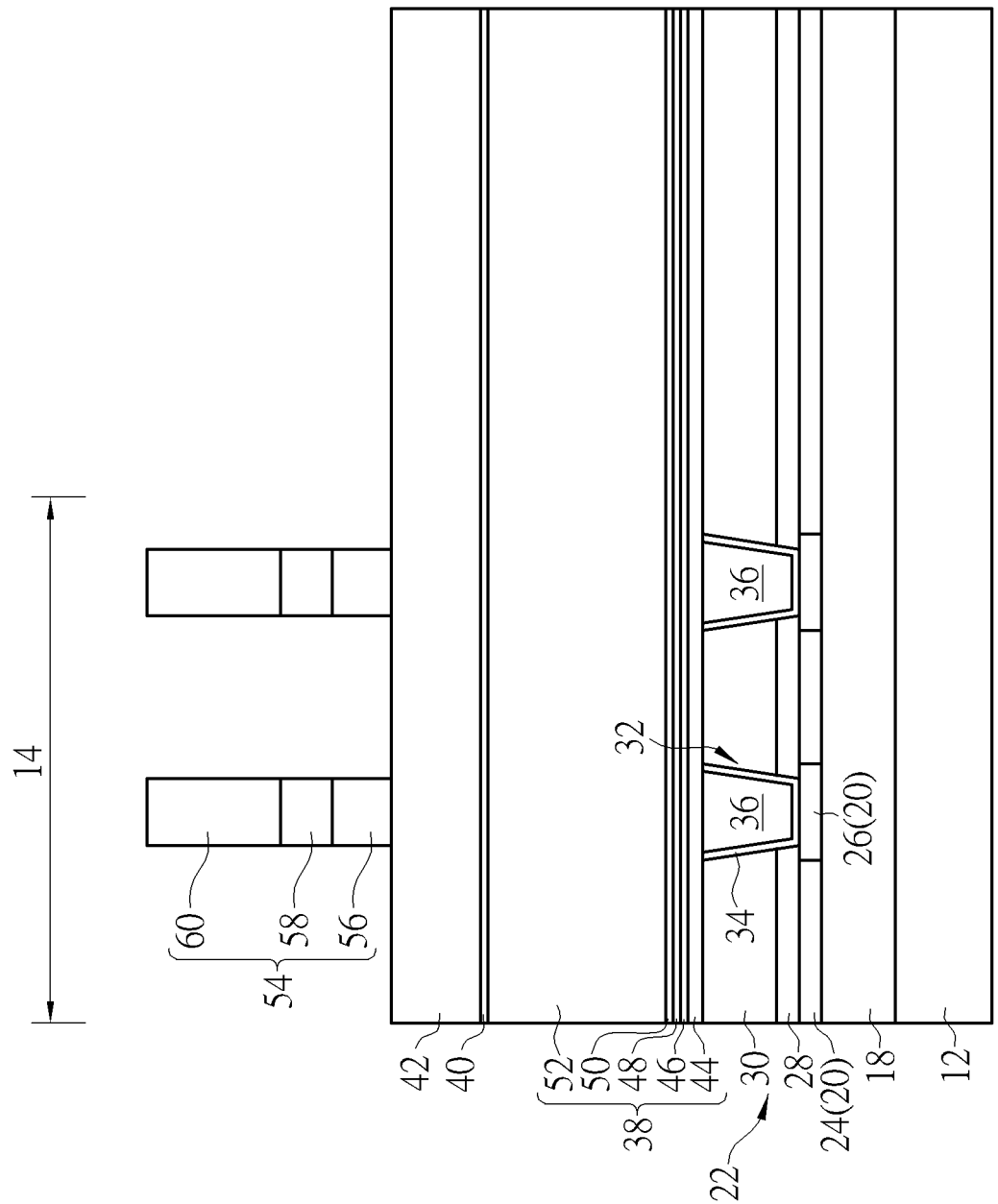
FIGS. 1-7 illustrate a method for fabricating a MRAM device according to an embodiment of the present invention.

Referring to FIGS. 1-7, FIGS. 1-7 illustrate a method for fabricating a semiconductor device, or more specifically a MRAM device according to an embodiment of the present invention. As shown in FIG. 1, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs), and a MTJ region 14 and a logic region 16 are defined on the substrate 12.

Active devices such as metal-oxide semiconductor (MOS) transistors, passive devices, conductive layers, and interlayer dielectric (ILD) layer 18 could also be formed on top of the substrate 12. More specifically, planar MOS transistors or non-planar (such as FinFETs) MOS transistors could be formed on the substrate 12, in which the MOS transistors could include transistor elements such as gate structures (for example metal gates) and source/drain region 80, spacer, epitaxial layer, and contact etch stop layer (CESL). The ILD layer 18 could be formed on the substrate 12 to cover the MOS transistors, and a plurality of contact plugs could be formed in the ILD layer 18 to electrically connect to the gate structure and/or source/drain region of MOS transistors. Since the fabrication of planar or non-planar transistors and ILD layer is well known to those skilled in the art, the details of which are not explained herein for the sake of brevity.

Next, metal interconnect structures 20, 22 are sequentially formed on the ILD layer 18 on the MTJ region 14 and the edge region 16 to electrically connect the aforementioned contact plugs, in which the metal interconnect structure 20 includes an inter-metal dielectric (IMD) layer 24 and metal interconnections 26 embedded in the IMD layer 24, and the metal interconnect structure 22 includes a stop layer 28, an IMD layer 30, and metal interconnections 32 embedded in the stop layer 28 and the IMD layer 30.

In this embodiment, each of the metal interconnections 26 from the metal interconnect structure 20 preferably includes a trench conductor and each of the metal interconnections 32 from the metal interconnect structure 22 on the MTJ region 14 includes a via conductor. Preferably, each of the metal interconnections 26, 32 from the metal interconnect structures 20, 22 could be embedded within the IMD layers 24, 30 and/or stop layer 28 according to a single damascene process or dual damascene process. For instance, each of the metal interconnections 26, 32 could further includes a barrier layer 34 and a metal layer 36, in which the barrier layer 34 could be selected from the group consisting of titanium (Ti), titanium nitride (TiN), tantalum (Ta), and tantalum nitride (TaN) and the metal layer 36 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layers 36 are preferably made of copper, the IMD layers 24, 30 are preferably made of silicon oxide, and the stop layers 28 is preferably made of nitrogen doped carbide (NDC), silicon nitride, silicon carbon nitride (SiCN), or combination thereof.

Next, a MTJ stack 38 or stack structure is formed on the metal interconnect structure 22, a cap layer 40 is formed on the MTJ stack 38, and another cap layer 42 formed on the cap layer 40. In this embodiment, the formation of the MTJ stack 38 could be accomplished by sequentially depositing a first electrode layer 44, a fixed layer 46, a free layer 48, a capping layer 50, and a second electrode layer 52 on the IMD layer 30. In this embodiment, the first electrode layer 44 and the second electrode layer 52 are preferably made of conductive material including but not limited to for example Ta, Pt, Cu, Au, Al, or combination thereof. The fixed layer 46 could be made of antiferromagnetic (AFM) material including but not limited to for example ferromanganese (FeMn), platinum manganese (PtMn), iridium manganese (IrMn), nickel oxide (NiO), or combination thereof, in which the fixed layer 46 is formed to fix or limit the direction of magnetic moment of adjacent layers. The free layer 48 could be made of ferromagnetic material including but not limited to for example iron, cobalt, nickel, or alloys thereof such as cobalt-iron-boron (CoFeB), in which the magnetized direction of the free layer 48 could be altered freely depending on the influence of outside magnetic field. The capping layer 50 could be made of insulating material including but not limited to for example oxides such as aluminum oxide (AlO$_x$) or magnesium oxide (MgO). Preferably, the cap layer 40 and cap layer 42 are made of different materials. For instance, the cap layer 40 is preferably made of silicon nitride and the cap layer 42 is made of silicon oxide, but not limited thereto.

Next, a patterned mask 54 is formed on the cap layer 42. In this embodiment, the patterned mask 54 could include an organic dielectric layer (ODL) 56, a silicon-containing hard mask bottom anti-reflective coating (SHB) 58, and a patterned resist 60.

Figure 2:
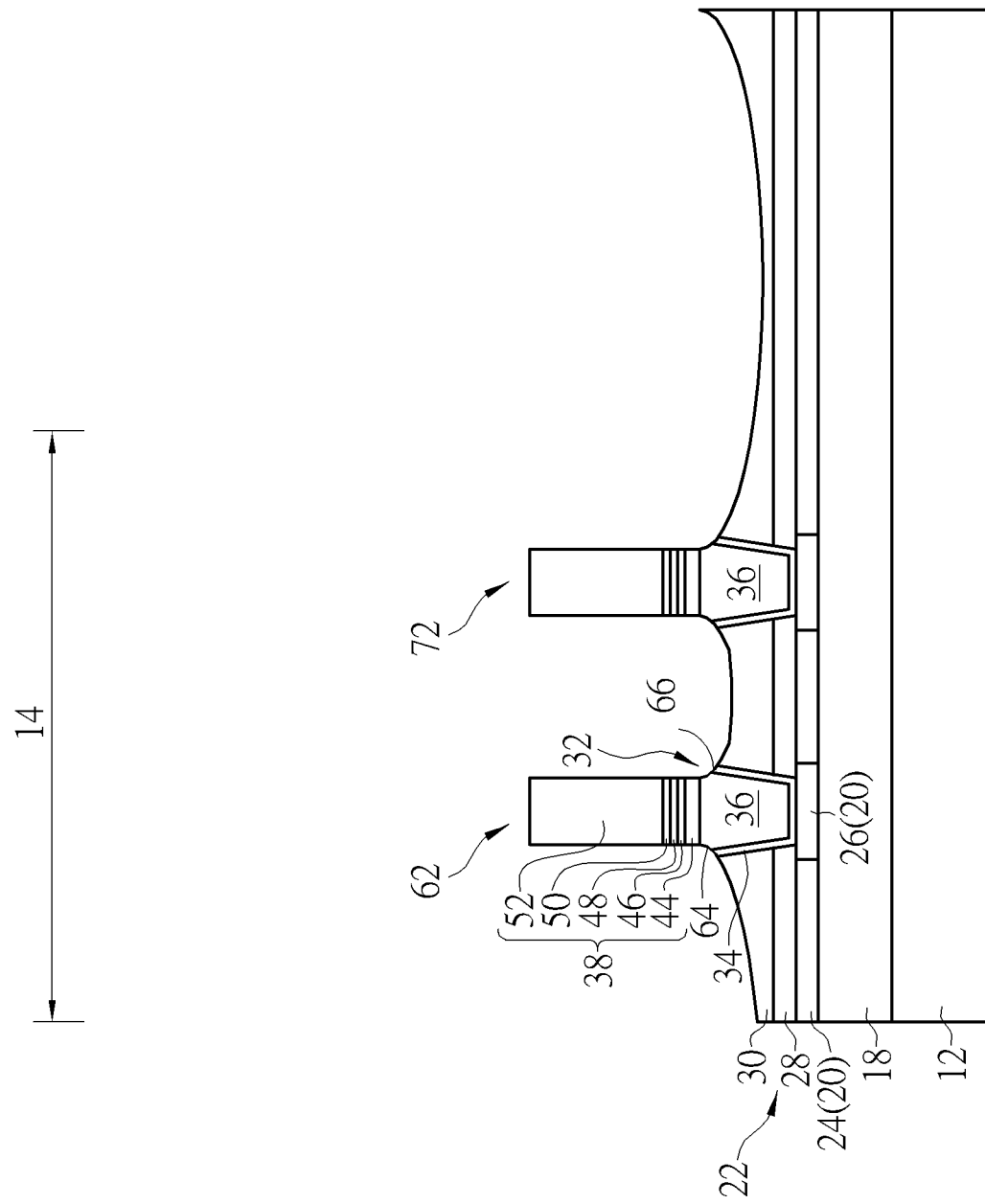

Next, as shown in FIG. 2, one or more etching process is conducted by using the patterned mask 54 as mask to remove part of the cap layers 40, 42, part of the MTJ stack 38, and part of the IMD layer 30 to form MTJ 62 and MTJ 72 on the MTJ region 14, in which the first electrode layer 44 at this stage preferably becomes a bottom electrode for the MTJs 62, 72 while the second electrode layer 52 becomes a top electrode for the MTJs 62, 72 and the cap layers 40, 42 could be removed during the etching process. It should be noted that this embodiment preferably conducts a reactive ion etching (RIE) process by using the patterned mask 54 as mask to remove part of the cap layers 40, 42 and part of the MTJ stack 38, strips the patterned mask 54, and then conducts an ion beam etching (IBE) process by using the patterned cap layer 42 as mask to remove part of the MTJ stack 38 and part of the IMD layer 30 to form MTJs 62, 72. Due to the characteristics of the IBE process, the top surface of the remaining IMD layer 30 is slightly lower than the top surface of the metal interconnections 32 after the IBE process and the top surface of the IMD layer 30 also reveals a curve or an arc.

It should also be noted that when the IBE process is conducted to remove part of the IMD layer 30, part of the metal interconnections 32 are removed at the same time so that a first slanted sidewall 64 and a second slanted sidewall 66 are formed on the metal interconnections 32 adjacent to the MTJ 62, in which each of the first slanted sidewall 64 and the second slanted sidewall 66 could further include a curve (or curved surface) or a planar surface.

Figure 3:
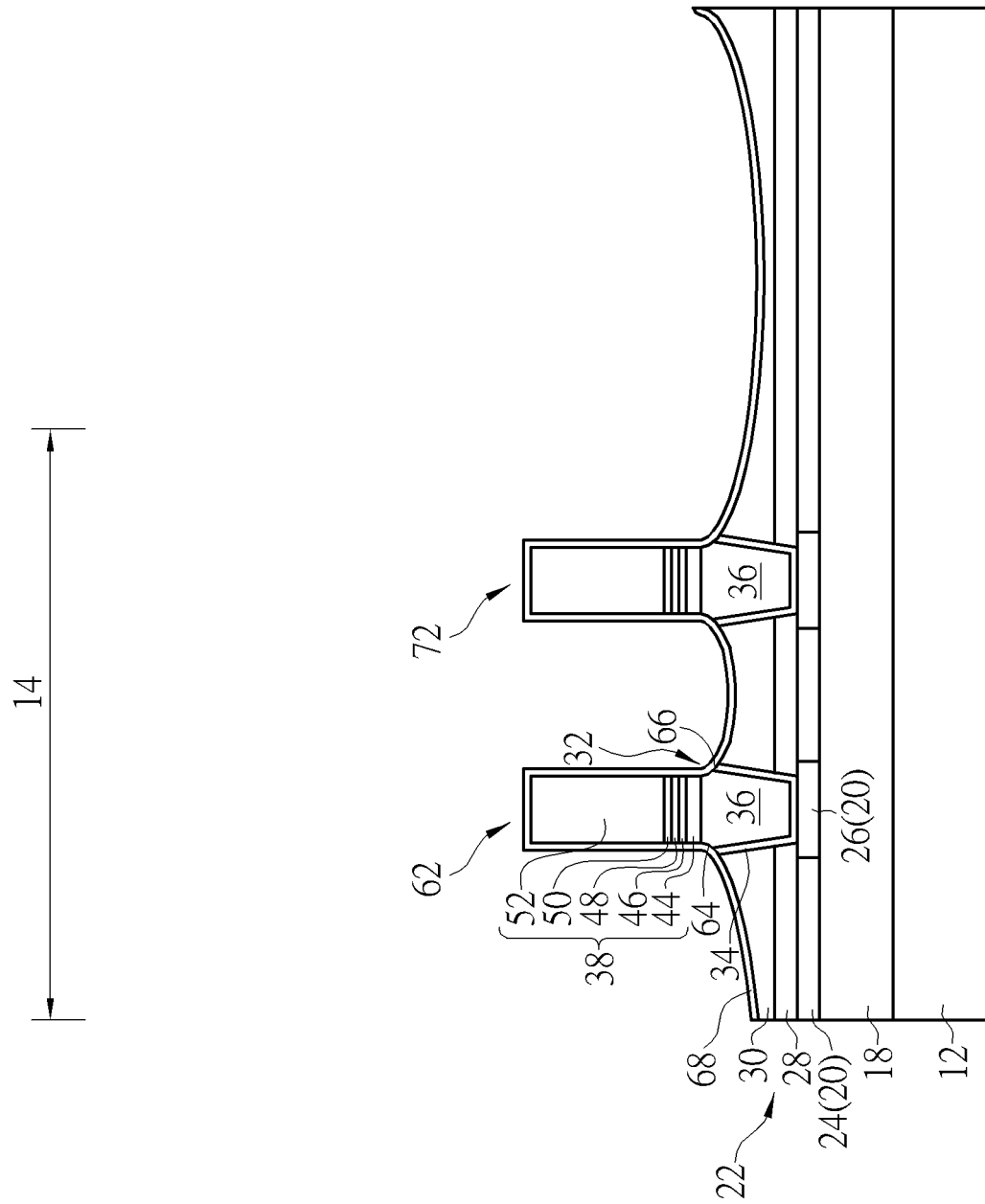

Next, as shown in FIG. 3, a liner 68 is formed on the MTJ 62, 72 to cover the surface of the IMD layer 30. In this embodiment, the liner 68 is preferably made of silicon oxide, but could also be made of other dielectric material including but not limited to for example silicon oxide, silicon oxynitride, or silicon carbon nitride.

Figure 4:
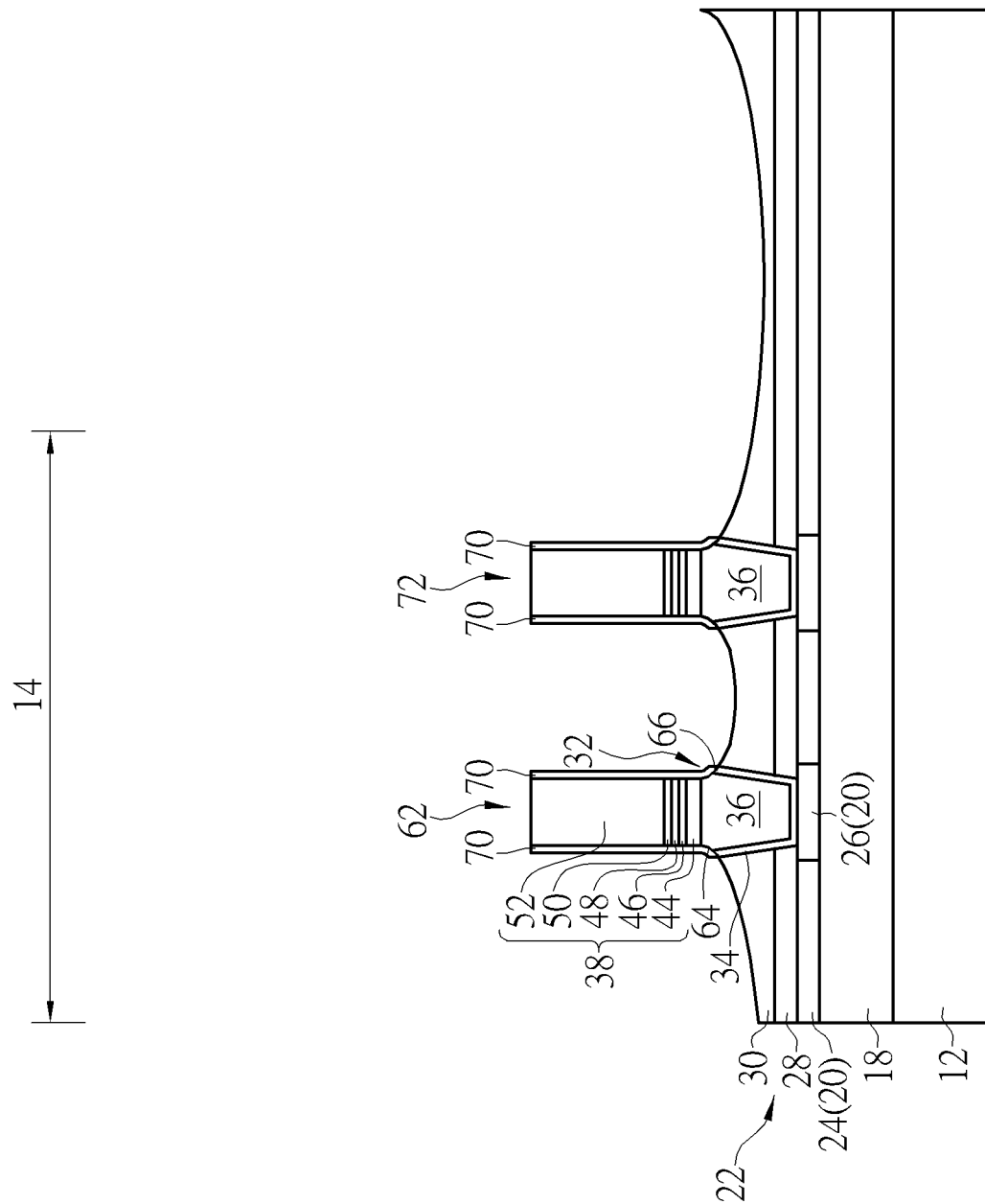

Next, as shown in FIG. 4, an etching process is conducted to remove part of the liner 68 to form a spacer 70 adjacent to each of the MTJs 62, 72, in which the spacer 70 is disposed on the sidewalls of each of the MTJs 62, 72 and at the same time covering and contacting the first slanted sidewalls 64 and second slanted sidewalls 66 of the metal interconnections 32 directly.

Figure 5:
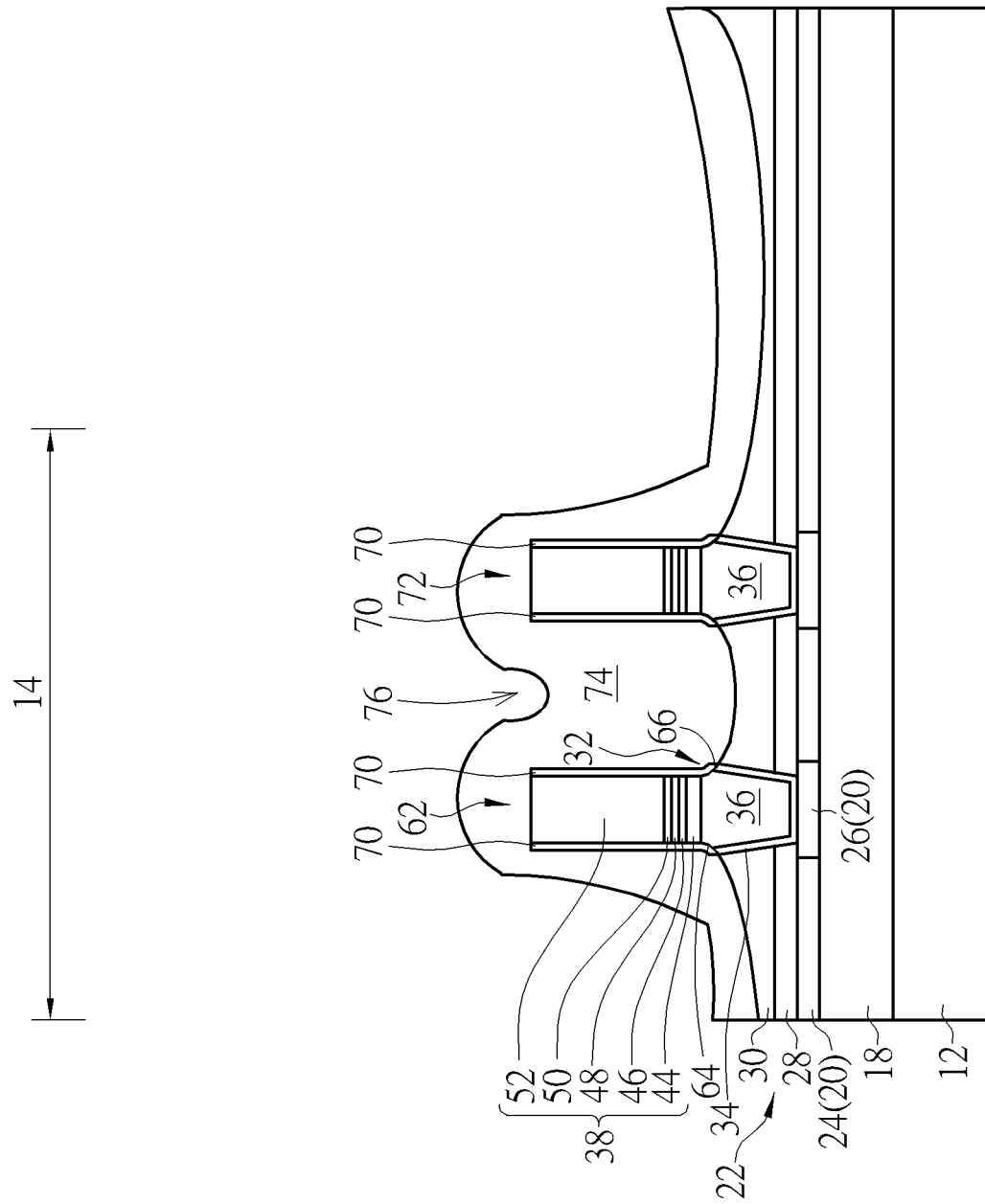

Next, as shown in FIG. 5, a passivation layer 74 is formed on the surface of the IMD layer 30 to fully cover the MTJs 62, 72. In this embodiment, the formation of the passivation layer 74 could be accomplished by an atomic layer deposition (ALD) process or high-density plasma (HDP) process and the passivation layer 74 could include but not limited to for example tetraethyl orthosilicate (TEOS), silicon oxide, silicon nitride, or combination thereof. It should be noted that an opening 76 or indentation is preferably formed between the MTJs 62, 72 when the passivation layer 74 is formed on top of the MTJs 62, 72.

Figure 6:
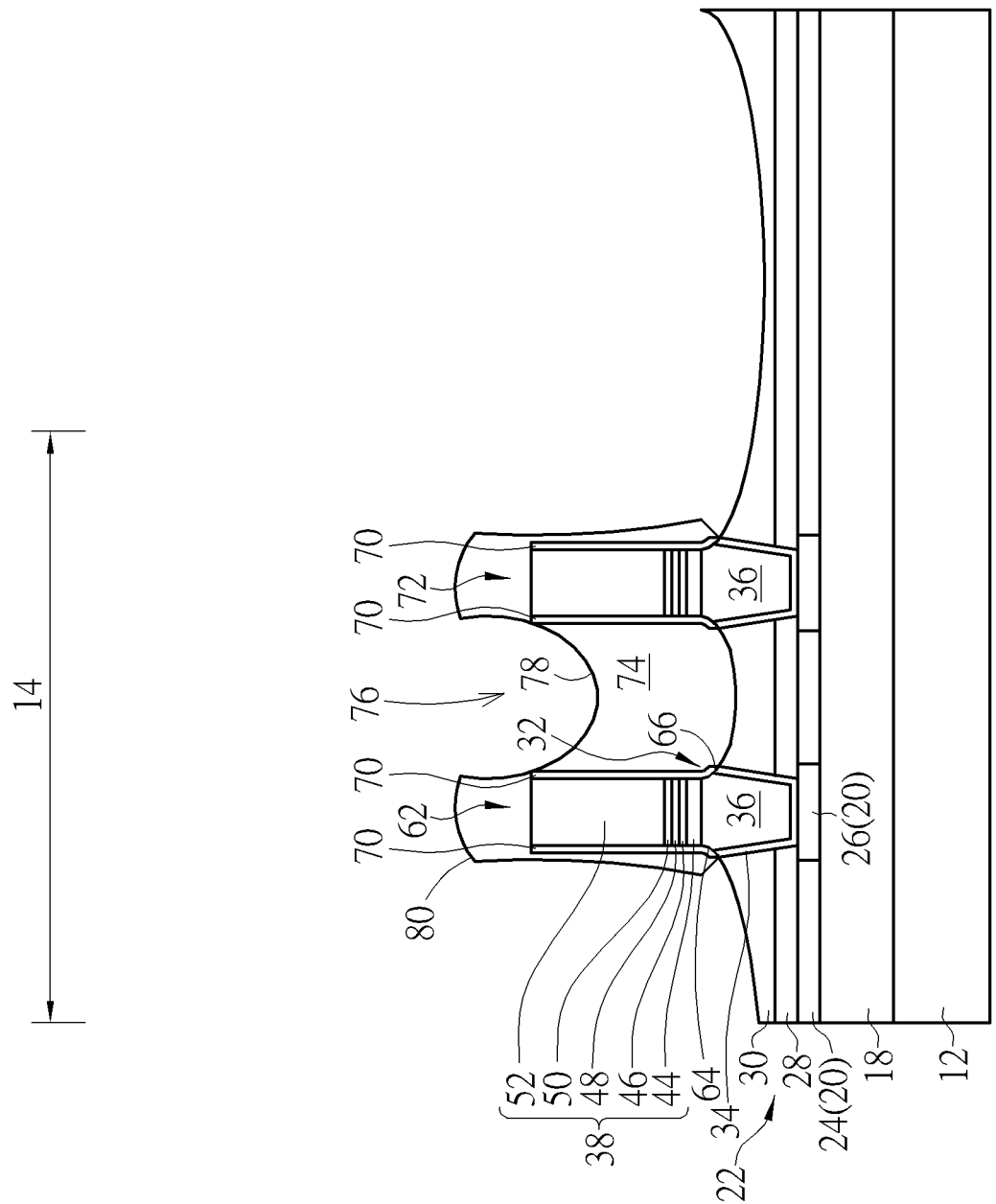

Next, as shown in FIG. 6, an etching process is conducted to remove part of the passivation layer 74 including part of the passivation layer 74 on left side of the MTJ 62, part of the passivation layer 74 on right side of the MTJ 72, and part of the passivation layer 74 between the MTJs 62, 72. Preferably, the etching process exposes the surface of the IMD layer 30 on the left side of the MTJ 62 and right side of the MTJ 72 and expands the opening 76 between the MTJs 62, 72 without exposing the IMD layer 30 between the MTJs 62, 72. After the etching process is completed, the top surface of the passivation layer 74 preferably includes a curve 78 concave upward between the MTJs 62, 72 and a curve 80 concave downward directly on top of each of the MTJs 62, 72.

Figure 7:
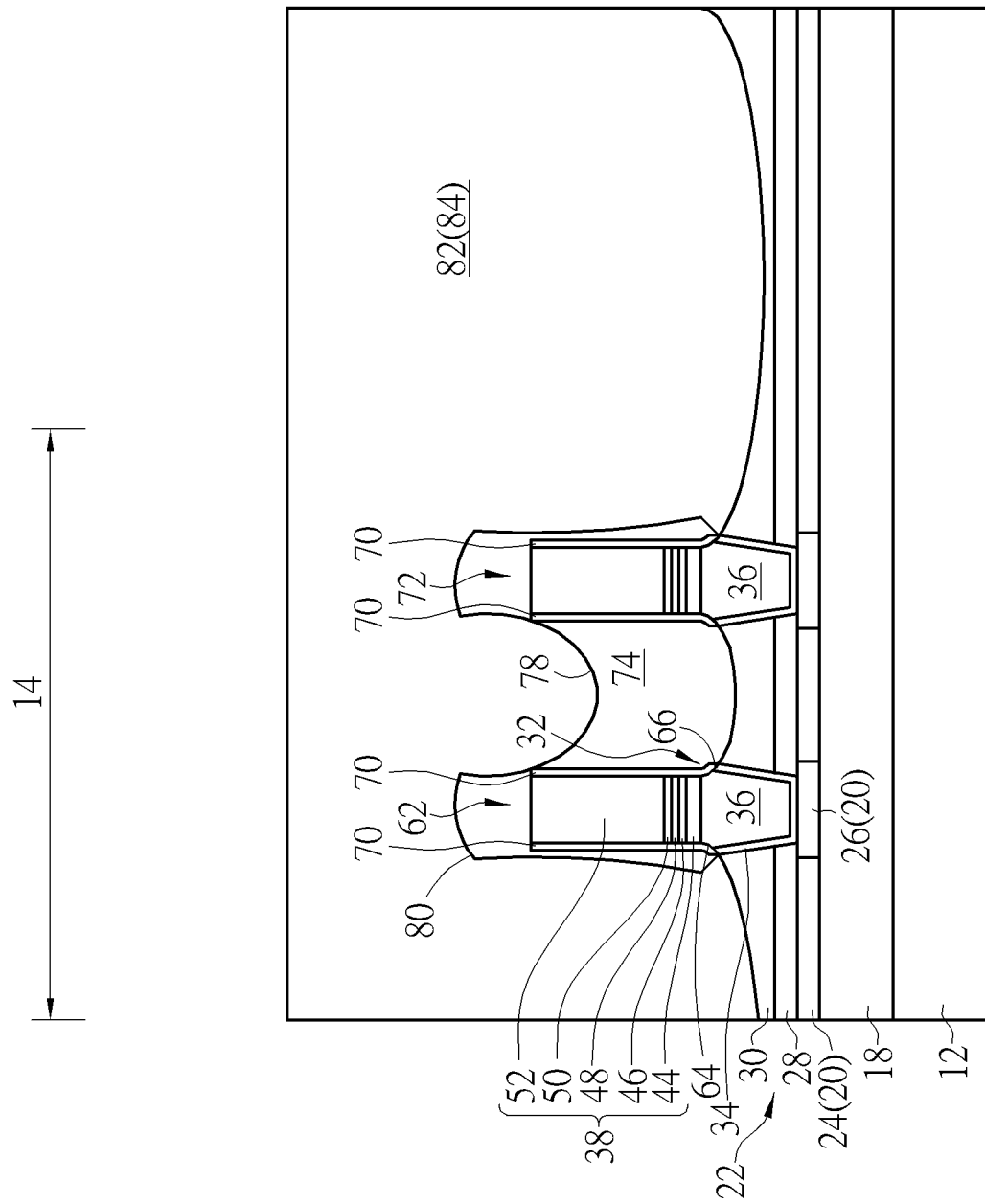

Next, as shown in FIG. 7, a ultra low-k (ULK) dielectric layer 82 serving as another IMD layer 84 is formed on the IMD layer 30 to cover the passivation layer 74, in which the ULK dielectric layer 82 preferably surrounds the MTJs 62, 72 without contacting the MTJs 62, 72 directly. In this embodiment, the ULK dielectric layer 82 and the passivation layer 74 are preferably made of different materials, in which the ULK dielectric layer 82 and the ULK dielectric layers disclosed in the later embodiments could all include porous dielectric materials including but not limited to for example silicon oxycarbide (SiOC). This completes the fabrication of a MRAM device according to an embodiment of the present invention.

Figure 8:
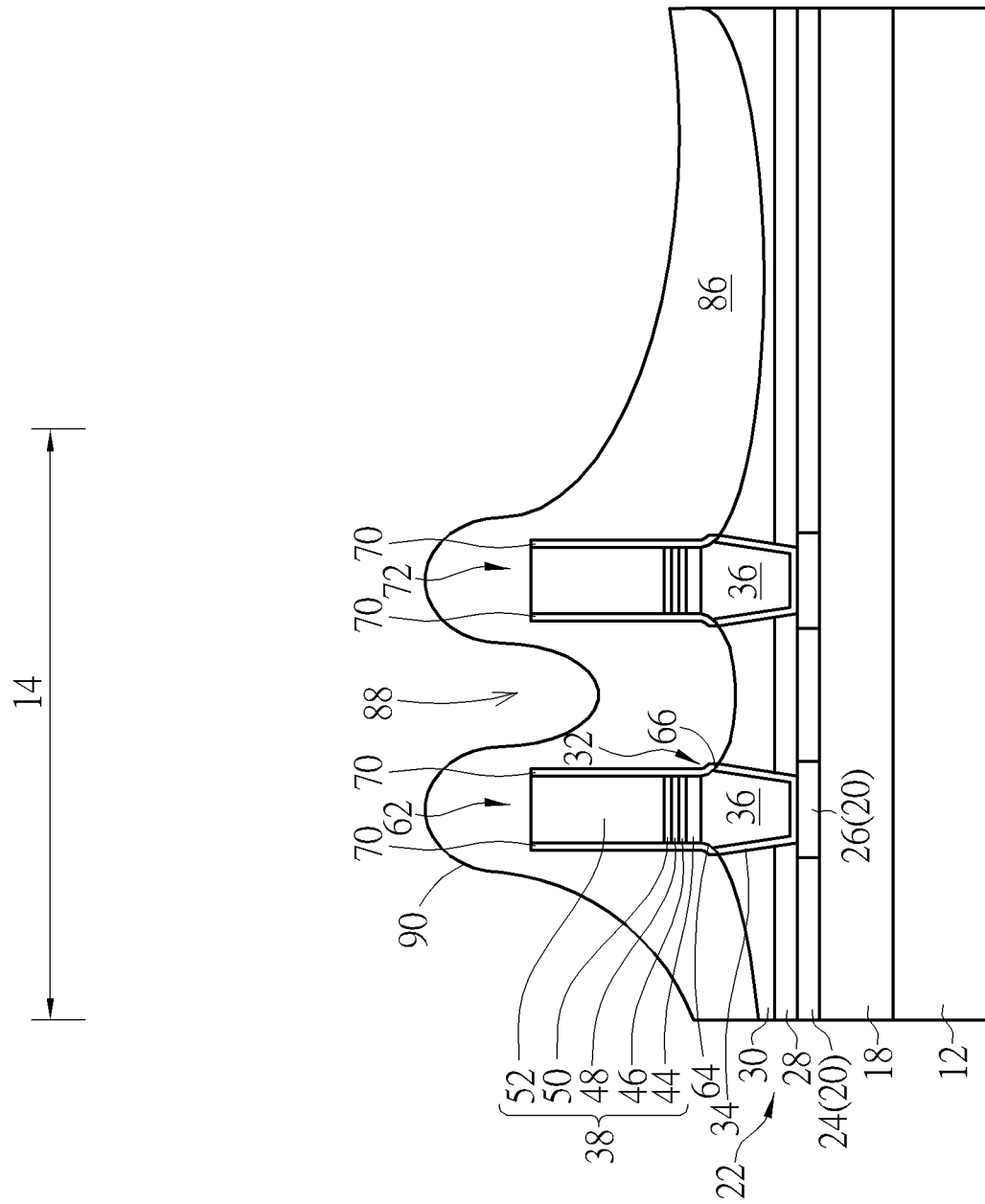
FIGS. 8-11 illustrate a method for fabricating a MRAM device according to an embodiment of the present invention.

Referring to FIGS. 8-11, FIGS. 8-11 illustrate a method for fabricating a MRAM device according to an embodiment of the present invention. As shown in FIG. 8, it would be desirable to first conduct the fabrication processes disclosed in FIGS. 1-4 to form MTJs 62, 72 on the substrate 12 and then form a ULK dielectric layer 86 on the MTJs 62, 72 and at the same time form a first opening 88 between the MTJs 62, 72, in which the top surface of the ULK dielectric layer 86 directly on top of each of the MTJs 62, 72 preferably includes a curve or more specifically a curve 90 concave downward.

Figure 9:
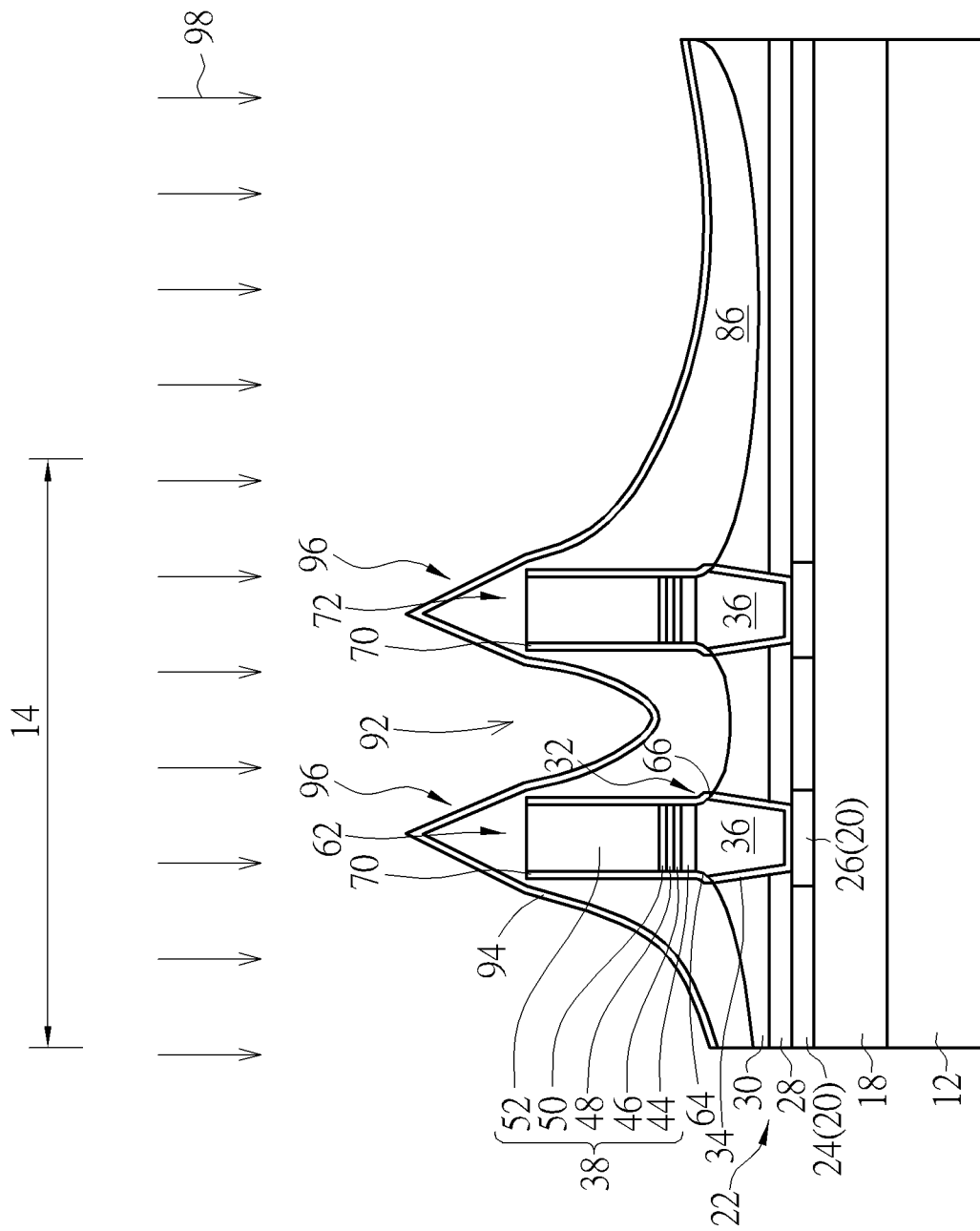

Next, as shown in FIG. 9, a first etching process 98 is conducted to remove part of the ULK dielectric layer 86 to form a second opening 92 between the MTJs 62, 72, in which a width of the first opening 88 is preferably less than a width of the second opening 92 and the definition of the width of the opening at this stage preferably refers to the maximum width between the MTJs 62, 72. It should be noted that during the later stage of the first etching process 98, nitrogen gas is preferably bombarded into the ULK dielectric layer 86 to transform part of the top surface of the ULK dielectric layer 86 into a damaged layer 94. Since the damaged layer 94 is formed by injecting nitrogen gas into the ULK dielectric layer 86, the damaged layer 94 formed at this stage preferably includes but not limited to for example silicon oxycarbonitride (SiOCN). It should also be noted that the first etching process 98 also removes part of the ULK dielectric layer 86 directly on top of each of the MTJs 62, 72 when the second opening 92 is formed so that the curve 90 concave downward directly on top of each of the MTJs 62, 72 is transformed into V-shape or more specifically reverse V-shape 96 profile at this stage.

Figure 10:
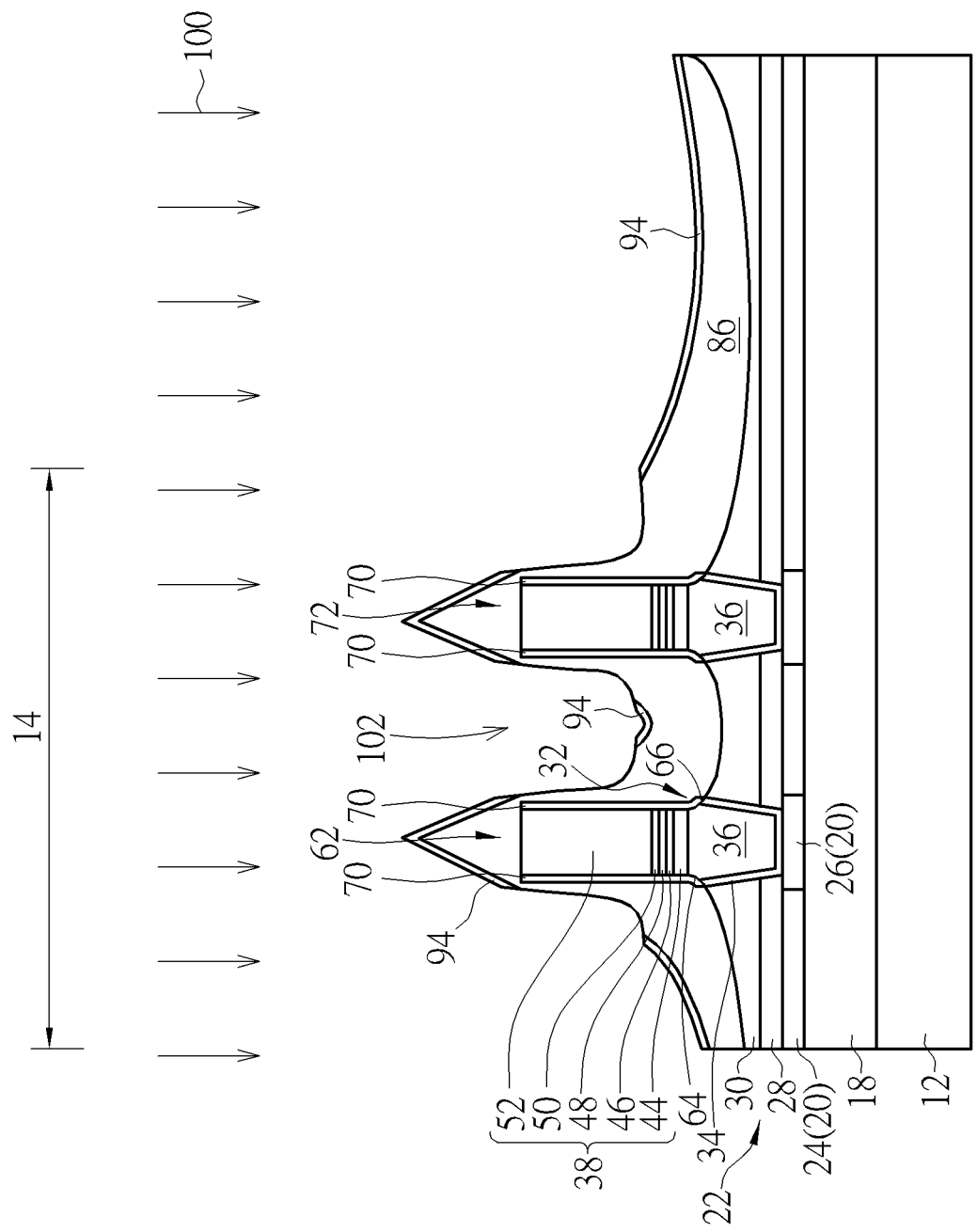

Next, as shown in FIG. 10, a selective second etching process 100 is conducted to remove part of the damaged layer 94 and part of the ULK dielectric layer 86 to form a third opening 102 between the MTJs 62, 72, in which the width of the second opening 92 is preferably less than the width of the third opening 102. It should be noted that the second etching process 100 preferably removes part of the damaged layer 94 adjacent to the sidewalls of the MTJs 62, 72 but not removing the damaged layer 94 directly on top of the MTJs 62, 72 and directly under the second opening 92 between the MTJs 62, 72. In other words, a portion of the damaged layer 94 having reverse V-shaped profile is still disposed directly on top of each of the MTJs 62, 72 and a portion of the damaged layer 94 is remained directly under the second opening 92 and between the MTJs 62, 72 after the second etching process 100 is completed while no damaged layer 94 is remained on the surface of the ULK dielectric layer 86 on sidewalls of the MTJs 62, 72. Preferably, the second etching process 100 could be accomplished by the involvement of diluted hydrofluoric acid (dHF) or SiCoNi process. It is to be noted that the SiCoNi process is commonly conducted by reacting fluorine-containing gas with silicon oxide to form $((NH_4)_2SiF_6)$ thereby removing native oxide, in which the fluorine-containing gas could include HF or $NF_3$.

Figure 11:
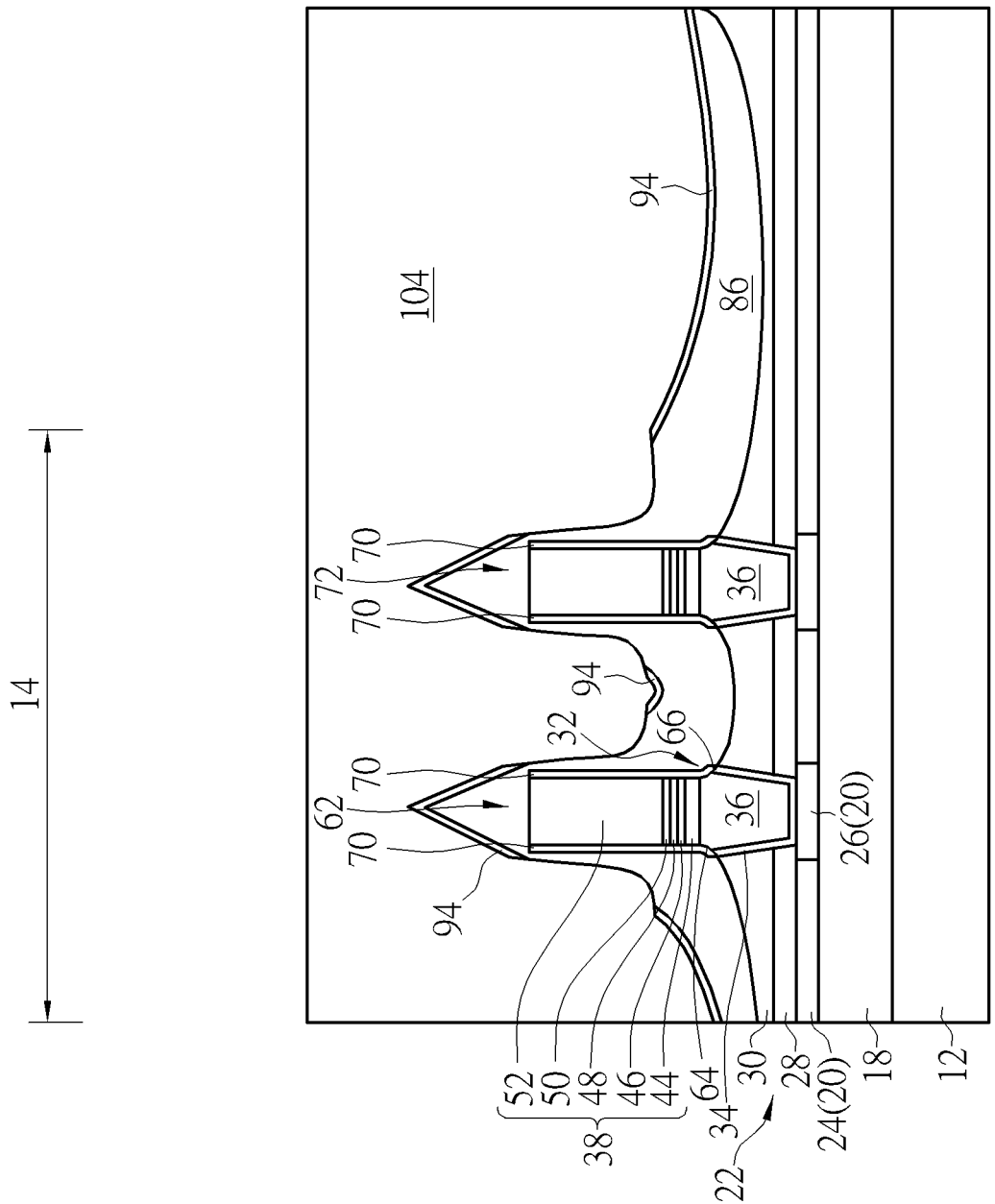

Next, as shown in FIG. 11, another ULK dielectric layer 104 is formed on the damaged layer 94 to fully cover the MTJs 62, 72, in which the ULK dielectric layer 104 surrounds the MTJs 62, 72 without contacting the MTJs 62, 72 directly. In this embodiment, the ULK dielectric layer 104 and the ULK dielectric layer 86 directly under the damaged layer 94 could include same or different materials. For instance, the ULK dielectric layers 86, 104 could include porous dielectric materials including but not limited to for example silicon oxycarbide (SiOC). This completes the fabrication of a MRAM device according to an embodiment of the present invention.

Figure 12:
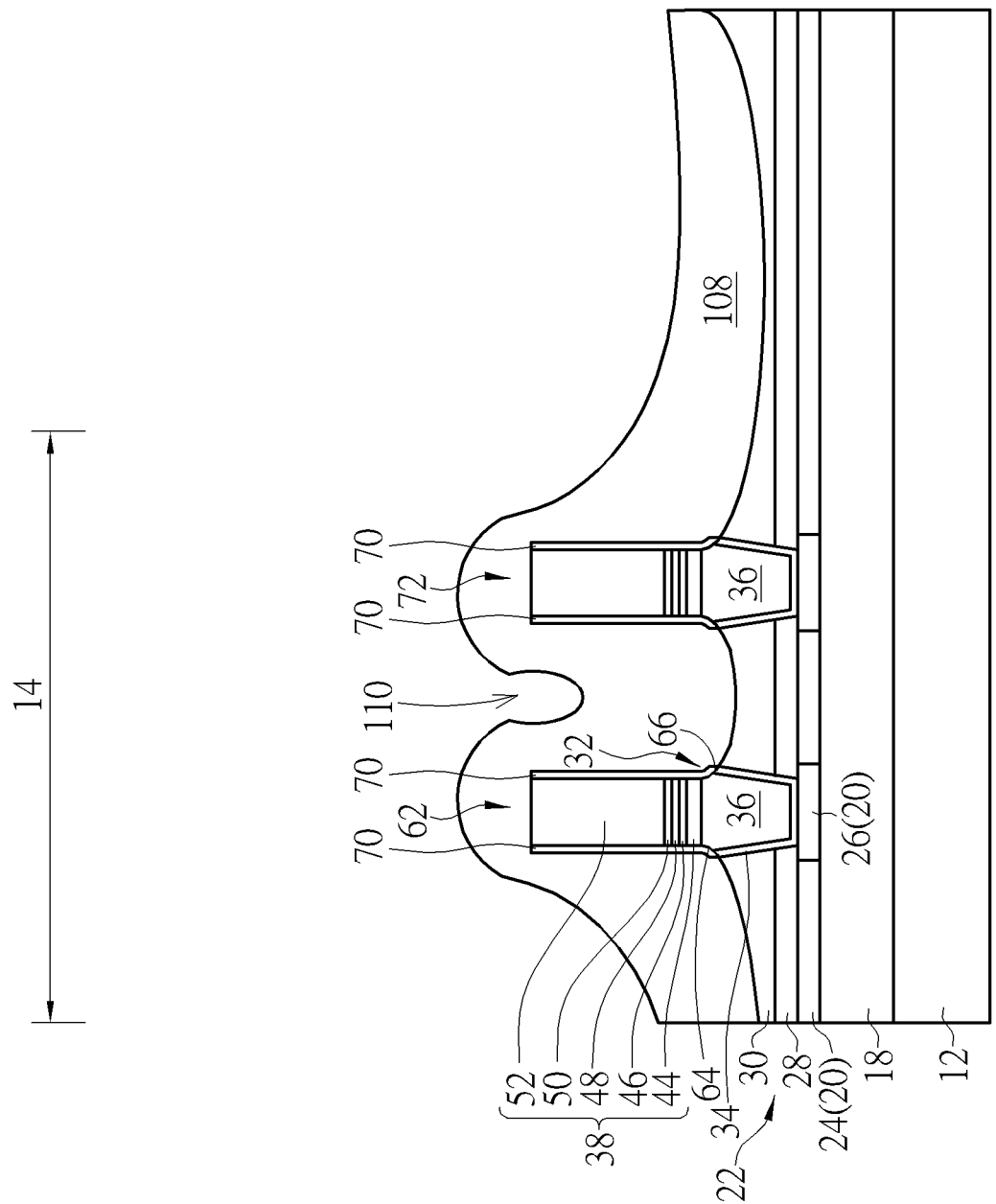
FIGS. 12-14 illustrate a method for fabricating a MRAM device according to an embodiment of the present invention.
Figure 13:
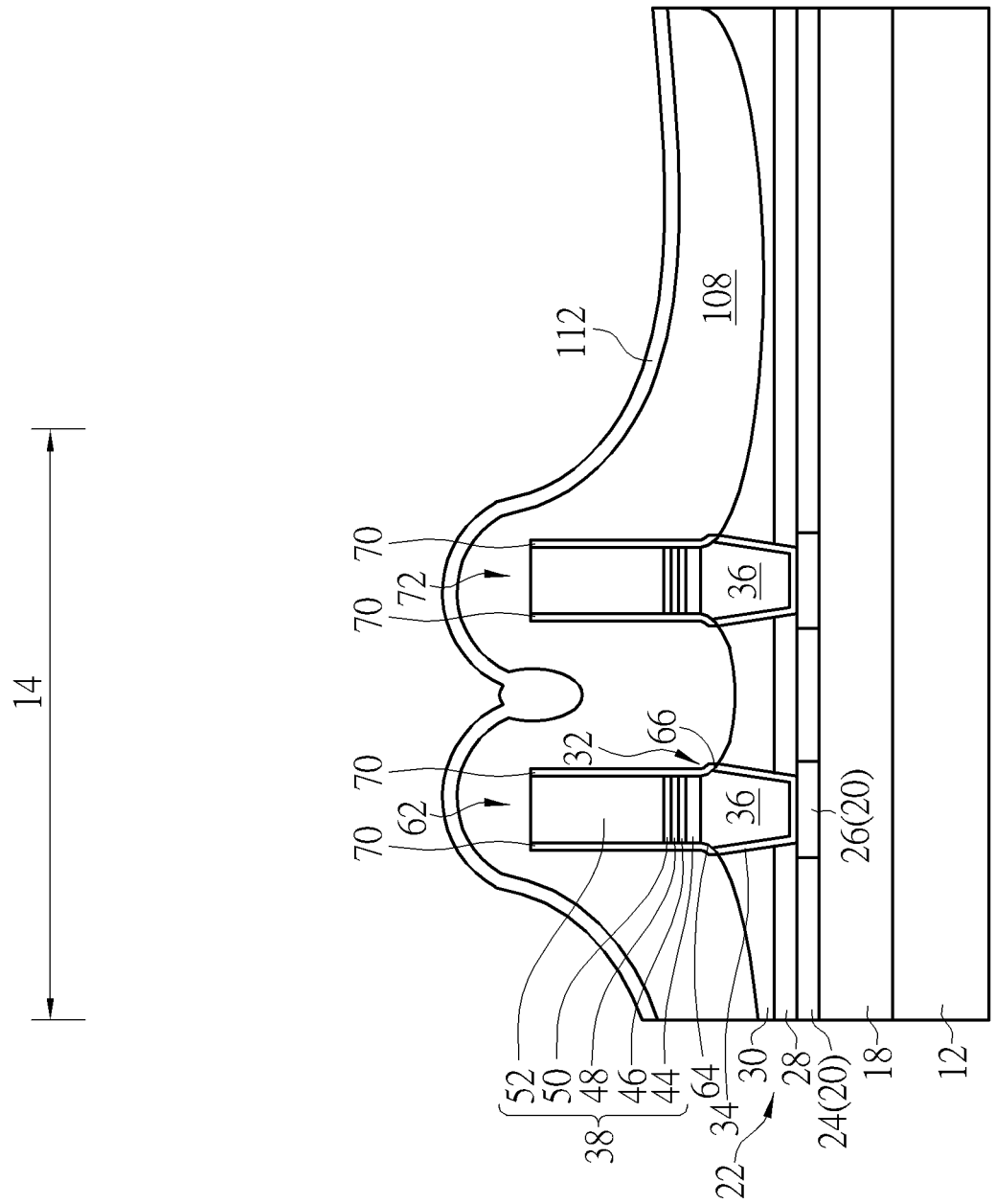
Figure 14:
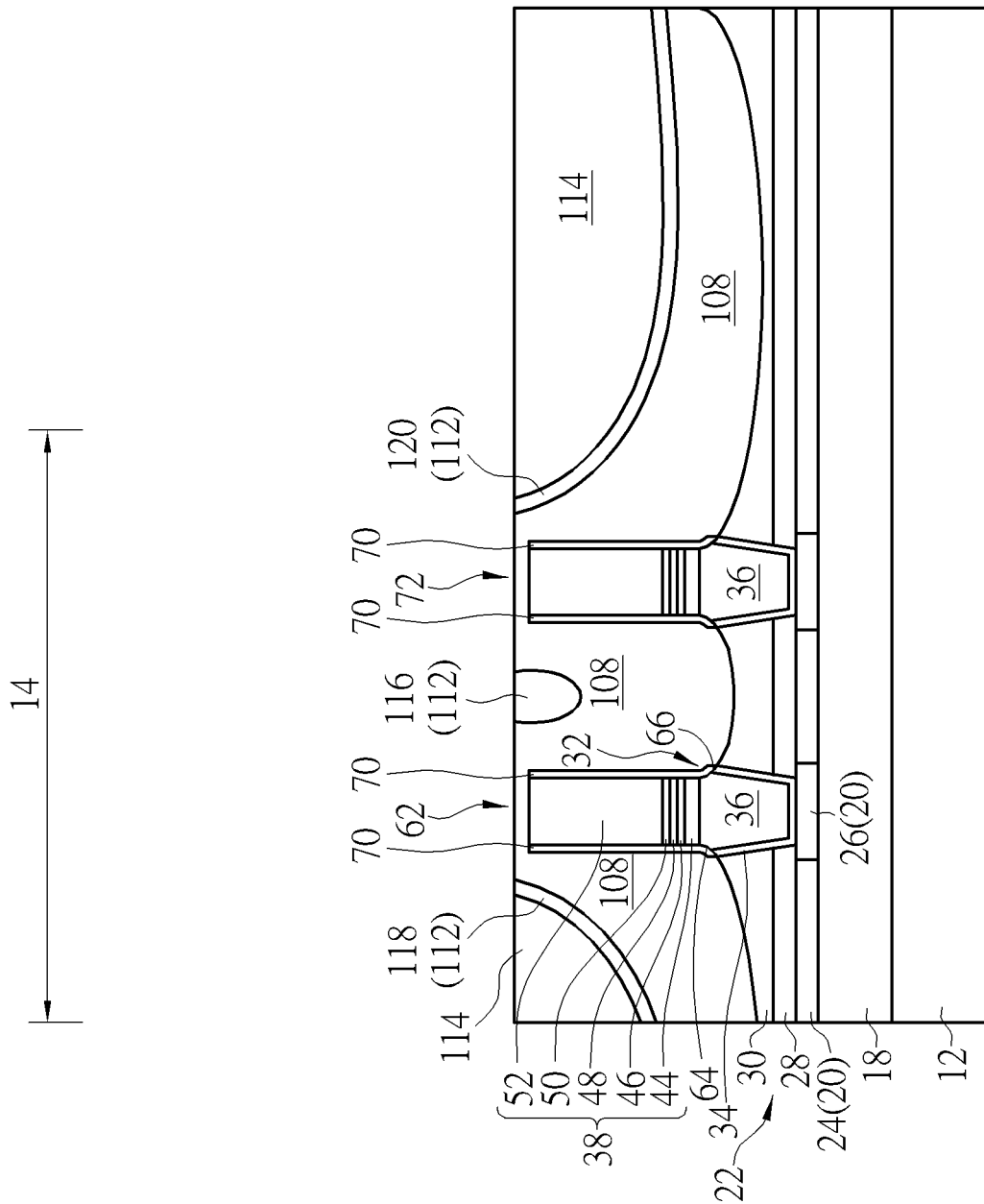

Referring to FIGS. 12-14, FIGS. 12-14 illustrate a method for fabricating a MRAM device according to an embodiment of the present invention. As shown in FIG. 12, it would be desirable to first conduct the fabrication processes disclosed in FIGS. 1-4 to form MTJs 62, 72 on the substrate 12 and then form a ULK dielectric layer 108 on the MTJs 62, 72 and at the same time form an opening 110 or void between the MTJs 62, 72, in which the top surface of the ULK dielectric layer 108 directly on top of each of the MTJs 62, 72 preferably includes a curve concave downward.

Next, as shown in FIG. 13, a passivation layer 112 is formed on the ULK dielectric layer 108 to fill the opening 110. In this embodiment, the formation of the passivation layer 112 could be accomplished by an atomic layer deposition (ALD) process or high-density plasma (HDP) process, in which the passivation layer 112 and the ULK dielectric layer 108 are preferably made of different materials including but not limited to for example TEOS, silicon oxide, silicon nitride, or combination thereof.

Next, as shown in FIG. 14, another ULK dielectric layer 114 is formed on the passivation layer 112, in which the ULK dielectric layer 114 and the passivation layer 112 are preferably made of different materials while the two ULK dielectric layers 108, 114 could be made of same or different materials. Next, a planarizing process such as chemical mechanical polishing (CMP) process is conducted to remove part of the ULK dielectric layer 114, part of the passivation layer 112, and part of the ULK dielectric layer 108 so that the top surfaces of the ULK dielectric layer 114, the passivation layer 112, and the ULK dielectric layer 108 are coplanar. This completes the fabrication of a MRAM device according to an embodiment of the present invention.

Referring again to FIG. 14, which further illustrates a structural view of a MRAM device according to an embodiment of the present invention. As shown in FIG. 14, the MRAM device preferably includes MTJs 62, 72 disposed on the substrate 12, ULK dielectric layer 108 dispose don the MTJs 62, 72, another ULK dielectric layer 114 disposed on the ULK dielectric layer 108, and a passivation layer 112 disposed between the ULK dielectric layers 108, 114.

Viewing form a more detailed perspective, the passivation layer 112 preferably includes three portions including a passivation layer 116 disposed in the ULK dielectric layer 108 and between the MTJs 62, 72, a passivation layer 118 disposed between the ULK dielectric layer 108 and the ULK dielectric layer 114 while the MTJ 62 is between the passivation layers 116, 118, and a passivation layer 120 is disposed between the ULK dielectric layer 108 and the ULK dielectric layer 114 while the MTJ 72 is between the passivation layers 116, 120. Preferably, the passivation layer 116 disposed between the MTJs 62, 72 only contacts the ULK dielectric layer 108 directly but not contacting the ULK dielectric layer 114 while the passivation layers 118, 120 contacts the ULK dielectric layers 108, 114 at the same time.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising: forming a first magnetic tunneling junction (MTJ) on a substrate; performing an atomic layer deposition (ALD) process to form a passivation layer on the first MTJ; performing an etching process to remove the passivation layer adjacent to the first MTJ; and forming an ultra low-k (ULK) dielectric layer on the passivation layer, wherein the passivation layer comprises a curve concave downward directly on top of the first MTJ.

2. The method of claim 1, further comprising:
   forming the first MTJ and a second MTJ on the substrate; and forming the passivation layer on the first MTJ and the second MTJ and forming an opening between the first MTJ and the second MTJ.

3. The method of claim 2, further comprising performing the etching process for expanding the opening.

4. The method of claim 2, wherein the passivation layer comprises a curve concave upward between the first MTJ and the second MTJ.

5. The method of claim 2, wherein the passivation layer comprises a curve concave downward directly on top of the second MTJ.

6. The method of claim 1, wherein the passivation layer comprises tetraethyl orthosilicate (TEOS), silicon oxide, or silicon nitride.

7. A method for fabricating semiconductor device, comprising:
   providing a substrate comprising a magnetic tunneling junction (MTJ) region and a logic region;
   forming a first magnetic tunneling junction (MTJ) on the MTJ region;
   performing a high-density plasma (HDP) process to form a passivation layer on the first MTJ; and
   forming an ultra low-k (ULK) dielectric layer on the passivation layer, wherein a bottom surface of the ULK dielectric layer on the MTJ region is lower than a top surface of the first MTJ.

8. The method of claim 7, further comprising:
   forming the first MTJ and a second MTJ on the substrate
   forming the passivation layer on the first MTJ and the second MTJ and forming an opening between the first MTJ and the second MTJ; and
   performing an etching process to remove the passivation layer adjacent to the first MTJ and the second MTJ.

9. The method of claim 8, further comprising performing the etching process for expanding the opening.

10. The method of claim 8, wherein the passivation layer comprises a curve concave upward between the first MTJ and the second MTJ.

11. The method of claim 8, wherein the passivation layer comprises a curve concave downward directly on top of the first MTJ.

12. The method of claim 8, wherein the passivation layer comprises a curve concave downward directly on top of the second MTJ.

13. The method of claim 7, wherein the passivation layer comprises tetraethyl orthosilicate (TEOS), silicon oxide, or silicon nitride.

\* \* \* \* \*